United States Patent
Chung et al.

(10) Patent No.: US 7,271,988 B2
(45) Date of Patent: Sep. 18, 2007

(54) METHOD AND SYSTEM TO PROTECT ELECTRICAL FUSES

(75) Inventors: Shine Chung, Sanchung (TW); Jiann-Tseng Huang, Hsinchu (TW); Shao-Chang Huang, Hsinchu (TW)

(73) Assignee: Taiwan Semiconductor Manufacturing Company (TW)

( * ) Notice: Subject to any disclaimer, the term of this patent is extended or adjusted under 35 U.S.C. 154(b) by 329 days.

(21) Appl. No.: 11/010,036

(22) Filed: Dec. 10, 2004

(65) Prior Publication Data

US 2006/0028777 A1    Feb. 9, 2006

Related U.S. Application Data

(60) Provisional application No. 60/599,003, filed on Aug. 4, 2004.

(51) Int. Cl.
*H02H 9/00* (2006.01)
*G11C 17/18* (2006.01)

(52) U.S. Cl. ..................... 361/56; 365/255.7
(58) Field of Classification Search .............. 361/56; 365/225.7
See application file for complete search history.

(56) References Cited

U.S. PATENT DOCUMENTS

| | | | | |
|---|---|---|---|---|
| 4,887,239 A | * | 12/1989 | Turner | ............ 365/185.04 |
| 5,243,233 A | * | 9/1993 | Cliff | ............ 327/143 |
| 5,812,466 A | * | 9/1998 | Lee et al. | ............ 365/200 |
| 6,028,474 A | * | 2/2000 | Ito | ............ 327/544 |
| 6,292,422 B1 | * | 9/2001 | Pitts | ............ 365/225.7 |
| 6,537,868 B1 | * | 3/2003 | Yu | ............ 438/237 |
| 6,823,459 B1 | * | 11/2004 | Horikoshi et al. | ............ 726/17 |
| 2002/0122280 A1 | * | 9/2002 | Ker et al. | ............ 361/56 |
| 2003/0097627 A1 | * | 5/2003 | Ku | ............ 714/711 |
| 2004/0129952 A1 | * | 7/2004 | Griesmer et al. | ............ 257/202 |
| 2005/0270714 A1 | * | 12/2005 | Huang et al. | ............ 361/91.1 |

* cited by examiner

*Primary Examiner*—Michael Sherry
*Assistant Examiner*—Scott Bauer
(74) *Attorney, Agent, or Firm*—Duane Morris LLP (57) ABSTRACT

A method and system is disclosed for protecting electrical fuse circuitries. A electrical fuse circuit with electrostatic discharge (ESD) protection has at least one electrical fuse, a programming device coupled in series with the electrical fuse having at least a transistor for receiving a control signal for controlling a programming current flowing through the electrical fuse, a voltage source coupled to the fuse and the programming device for providing the programming current, and a protection module coupled to a gate of the transistor at its first end for reducing charges accumulated at the gate of the transistor due to electric static charges arriving at the voltage source, thereby preventing the programming device from accidentally programming the fuse.

6 Claims, 11 Drawing Sheets

METHOD AND SYSTEM TO PROTECT ELECTRICAL FUSES

CROSS REFERENCE

This application claims the benefits of U.S. Provisional Application Ser. No. 60/599,003 filed on Aug. 4, 2004 entitled "Electrical Fuse With Protection Schemes."

BACKGROUND

The present invention relates generally to semiconductor electrical fuse devices, and more particularly to the protection of electrical fuses from accidental programming and electric static discharge (ESD).

Demands are escalating for sub-micron semiconductor devices with high density, high reliability, and large-scale integration. These semiconductor devices require increased transistor and circuit performance, high reliability and increased manufacturing throughput.

Traditionally, integrated circuits containing these semiconductor devices include laser fuses, which are used to provide repairs to the circuit. These laser fuses are programmed by firing a low-power, extremely focused laser thereto, thereby melting the fuse and "blowing" it apart. Melted fuses are then used to repair one or more parts of an integrated circuit. As an example, lasers fuses are normally used during the testing portion of the manufacturing process before each individual integrated circuit is cut from a semiconductor wafer. Most integrated circuits have built-in test engines that detect any faults incurred during the manufacturing process, and share that information with an outside technician who While this method is effective, it is also tedious, time consuming, and prone to an operator's error. In addition, because laser fuses are also large in physical size, they typically use up too much space in a wafer. In modern day sub-micron designs, the large sizes of these laser fuses become an issue.

Another method to repair integrated circuits is to use electrical fuses. Electrical fuses are preferred to laser fuses because they can be placed anywhere under the metal structure of a chip, thus potentially allowing for thousands of fuses to be used in a single chip. Electrical fuses are designed to break when a large electrical current passes through them. By "blowing" these fuses during testing, technicians can monitor and adjust their functions to improve their quality, performance and power consumption without much human intervention.

However, there is currently no effective method to protect electrical fuses from false programming. Because the physical structure of an electrical fuse is very small and fragile, a typical resistance would range around 100 ohms, and devices with such small resistance are sensitive to electrical static discharge (ESD) and floating supply voltage that can reside inside an integrated circuit containing them. Both ESD and floating supply voltage can potentially cause these electrical fuses to accidentally program themselves while in the manufacturing stage or during physical contact in a human body model. Therefore, it is desirable in the art of electrical fuse designs to provide improved build-in protection, thereby increasing reliability and production yield.

SUMMARY

In view of the foregoing, the following provides a method and system to protect electrical fuses from accidental programming and electric static discharge (ESD).

In various embodiments, an electrical fuse circuit with ESD protection has at least one electrical fuse, a programming device coupled in series with the electrical fuse having at least a transistor for receiving a control signal for controlling a programming current flowing through the electrical fuse, a voltage source coupled to the fuse and the programming device for providing the programming current, and a protection module coupled to a gate of the transistor at its first end for reducing charges accumulated at the gate of the transistor due to electric static charges arriving at the voltage source, thereby preventing the programming device from accidentally programming the fuse.

The construction and method of operation of the invention, however, together with additional objects and advantages thereof will be best understood from the following description of specific embodiments when read in connection with the accompanying drawings.

DESCRIPTION

The following will provide a detailed description of various methods and circuits that provide protection to an electrical fuse.

Figure 1A:
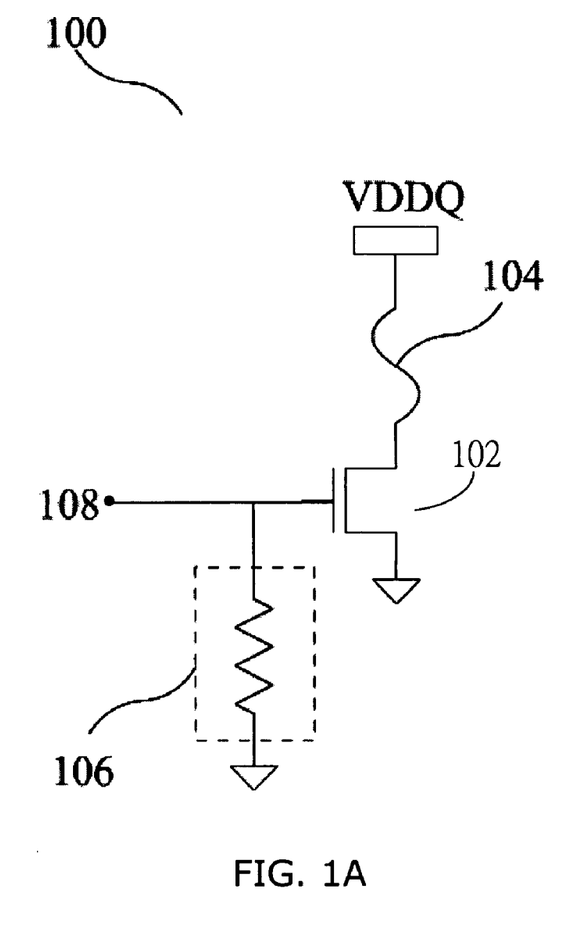
FIG. 1A illustrates a fuse programming device with protection in accordance with the first embodiment of the present invention.

FIG. 1A illustrates a fuse programming circuit 100 with protection in accordance with the first embodiment of the present invention. The fuse programming circuit 100 includes an electrical fuse 104 connected between a high voltage VDDQ and a transistor based programming device such as an NMOS 102. It is understood that a thick gate oxide transistor can be use, but not required. The gate of the NMOS 102 is pulled low through a protection module 106 if needed. The protection 106 is shown to be a resistance device to be coupled to VSS, or ground. The gate of the NMOS 102 receives a control signal via a node 108. The high voltage VDDQ is used to program the electrical fuse 104.

During normal operation of the integrated circuit (IC), the node 108 will be grounded due to the protection module 106 and the low state of a pre-driver (not shown) coupled to the node 108. When the high voltage VDDQ is applied during the programming stage, and if the electrical fuse 104 is selected for programming, the node 108 will turn high. This turns on the NMOS 102, thereby allowing a programming current to flow through and break the electrical fuse 104.

When an electrical static discharge (ESD) event occurs, a positive ESD voltage is generated that is significantly higher than the high voltage VDDQ with respect to VSS. The high ESD voltage may AC-couple the drain-gate capacitance of the NMOS 102. If so, charges may accumulate at the gate of the transistor 102, and they would accidentally turn on the NMOS 102. Without the protection of the protection module 106, which is a resistance in this case, the NMOS 102 may accidentally break the electrical fuse 104. The protection module quickly dissipates the charges and reduces the voltage level at the gate of the NMOS 102 so that it would not be turned on to programming the electric fuse 104.

Similarly, if internal supply VDD is floating, the program signal at the node 108 is floating high. When the high voltage VDDQ is applied, the electrical fuse 104 may be programmed accidentally if the protection module 106 does not exist. It is noted that a typical embodiment of the protection module 106 is a linear resistor or a zero-Vt MOS device measuring around 10 k ohms to ensure good protection.

Figure 1B:
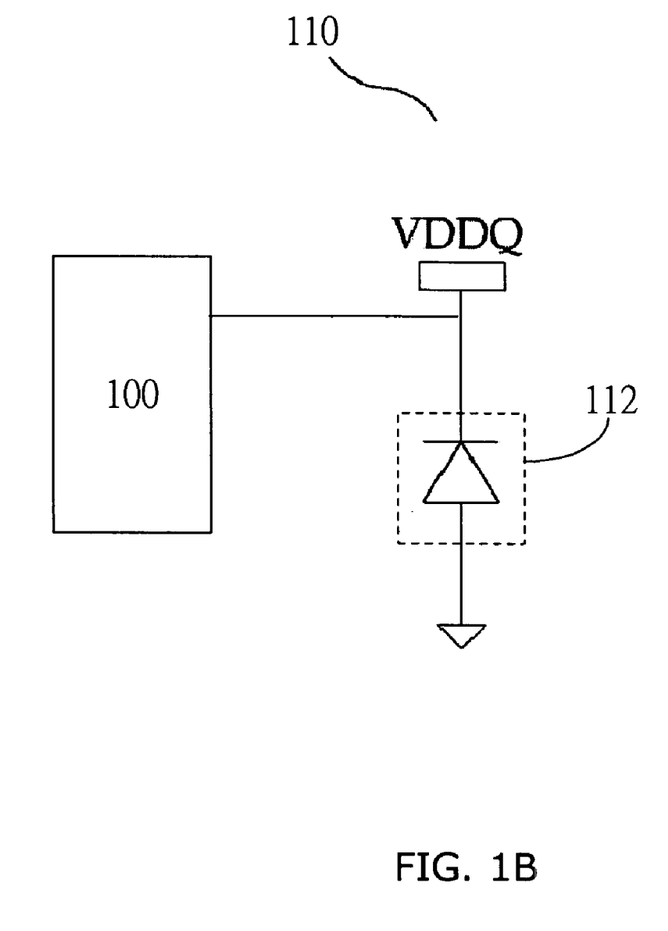
FIG. 1B presents a diagram showing a fuse programming device coupled to a reverse-biased ESD protection module in accordance with various embodiments of the present invention.

FIG. 1B presents a diagram 110 showing a fuse programming circuit 100 coupled to a reverse-biased voltage source clamping module 112 through the high voltage VDDQ in accordance with an embodiment of the present invention. The reverse-biased voltage source clamping module 112 is shown to include a clamp diode connected between VDDQ and ground.

Conventional ESD protection in a high voltage environment is built at the VDDQ pad of an IC. When an ESD event occurs, it may generate a large negative ESD voltage that may damage the interior fuse cells if the VDDQ pad ESD protection is not well-designed to protect the interior fuse cells. It is desirable to improve the chip interior ESD performance with added ESD protection circuit near fuse cells. In this case, interior ESD protection is provided by the reverse-biased voltage source clamping module 112 to be placed near to or under the VDDQ buses. When a large negative ESD occurs, and if the module 112 is a clamp diode, the clamp diode will be turned on and the node coupled to the high voltage VDDQ will be clamped to a diode's threshold voltage. It is noted that, for a clamp diode, it is preferred to be an N+/P− sub junction diode that clamps ESD to voltage levels of 0.7V. Normally the physical size of a clamp diode is large and can be built under ground or the VDDQ buses.

Figure 1C:
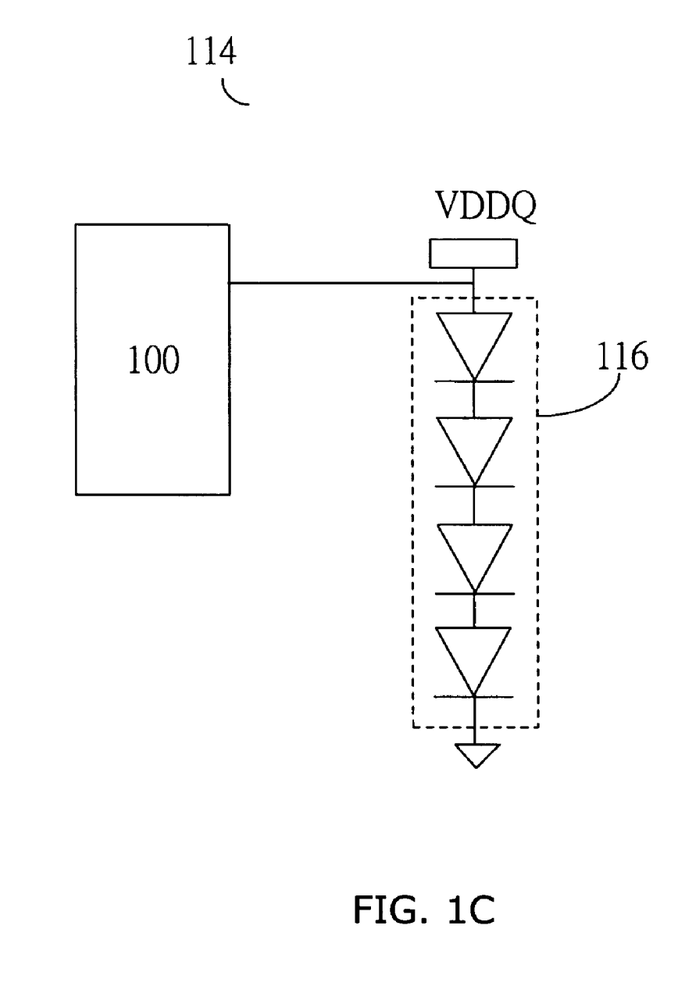
FIG. 1C presents a diagram showing a fuse programming device coupled to a forward-biased ESD protection module in accordance with various embodiments of the present invention.

FIG. 1C illustrates a diagram 114 showing a fuse programming circuit 100 coupled to a forward-biased voltage source clamping module 116 in accordance with various embodiments of the present invention. The forward-biased voltage source clamping module 116 is shown to include a diode string between VDDQ and ground and having four diodes connected in series. The anode and cathode ends of the diode string are connected to VDDQ and ground or VSS.

In this example, since the average turn-on voltage of each diode is approximately 0.7 volts at room temperature with a moderate current density, the node coupled to VDDQ will be clamped to 2.8 volts, which is the total sum of the turn-on voltage of the four diodes.

It is noted that the diodes are preferably P+, N-well junction diodes. The size of these diodes should be large enough such that it can carry a large amount of ESD current flow. These diodes should be well-guarded so that their parasitic vertical bipolar equivalent will not turn on, thereby affecting the threshold voltage of these diodes. Double guard rings should be placed inside and outside the N-wells to suppress the parasitic vertical bipolar gain when building these diodes for the forward biased voltage source protection. Since the physical sizes of these diodes are quite large, they can be built under interior ground or the VDDQ buses near the fuse array.

If an ESD event occurs, a positive ESD voltage is generated that is significantly higher than VDDQ with respect to VSS. The forward conducting diode string will conduct, resulting in a mass ESD current flow to ground and protection of any internal fuse array.

Figure 2:
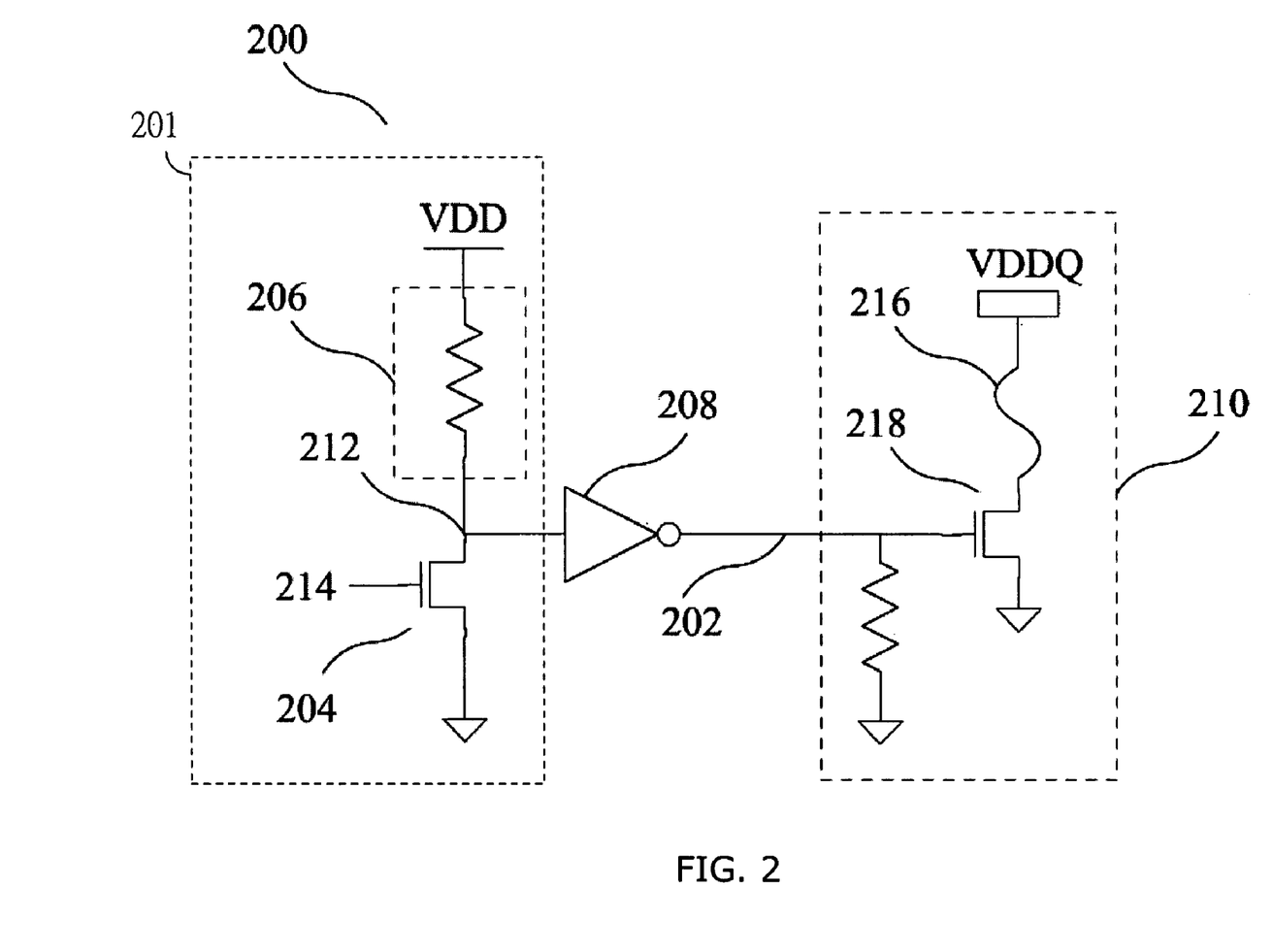
FIG. 2 presents a diagram showing how a pre-driver protection circuit protects a pre-driver typically connected to a fuse programming device in accordance with the second embodiment of the present invention.

FIG. 2 presents a diagram showing how a pre-driver protection circuit protects a pre-driver typically connected to a fuse programming circuit in accordance with the second embodiment of the present invention. In a diagram 200, a pre-driver protection circuit 201 serves to protect a strong inverter driver 208, which is coupled to a fuse programming circuit 210. The fuse programming circuit 210 is equivalent to the fuse programming circuit 100 in FIGS. 1A-1B. The pre-driver protection circuit 201 includes a pull-up resistance device such as a resistor 206 and an NMOS 204, the combination of which functions as an inverter. The output of the pre-driver protection circuit 201 is received by the driver 208, which outputs a control signal at a node 202 that is used to drive the fuse programming circuit 210. The size of the driver 208 needs to be sufficiently large to ensure that the control signal at the node 202 has a short transition rise time from low to high such that an electrical fuse 216 of the fuse programming circuit 210 can be programmed effectively.

During the programming stage, a program signal 214 will go high as to allow the NMOS 204 to turn on when the electrical fuse 216 is assigned to be programmed, and a high voltage supply VDDQ provides the necessary programming voltage.

The resistor 206 is designed to provide a direct path to VDD to ensure that a node 212 rises as VDD rises. A solid connection to VDD at the node 212 through the resistor 206 protects a program device 218 of the fuse programming circuit 210 from being over-driven by the driver 208, when the program signal 214 is floating. In other words, the mechanism protects the electrical fuse 216 from accidental programming during a power up process. It is noted that the voltage of the program signal 214 needs to be high enough to pull the resistor 206 low when programming the electrical fuse 216. If the electrical fuse 216 is not intended to be programmed, the program signal 214 is set to low so as to prevent the resistor 206 and the NMOS 204 from drawing any current and consuming power.

It is understood that the resistor 206 may be replaced with a gate-grounded PMOS. A gate-grounded PMOS will be turned on when VDD is higher than the threshold voltage of the gate-grounded PMOS. Similarly, a NMOS device with its gate tied to a high voltage level can also function equivalently.

Figure 3A:
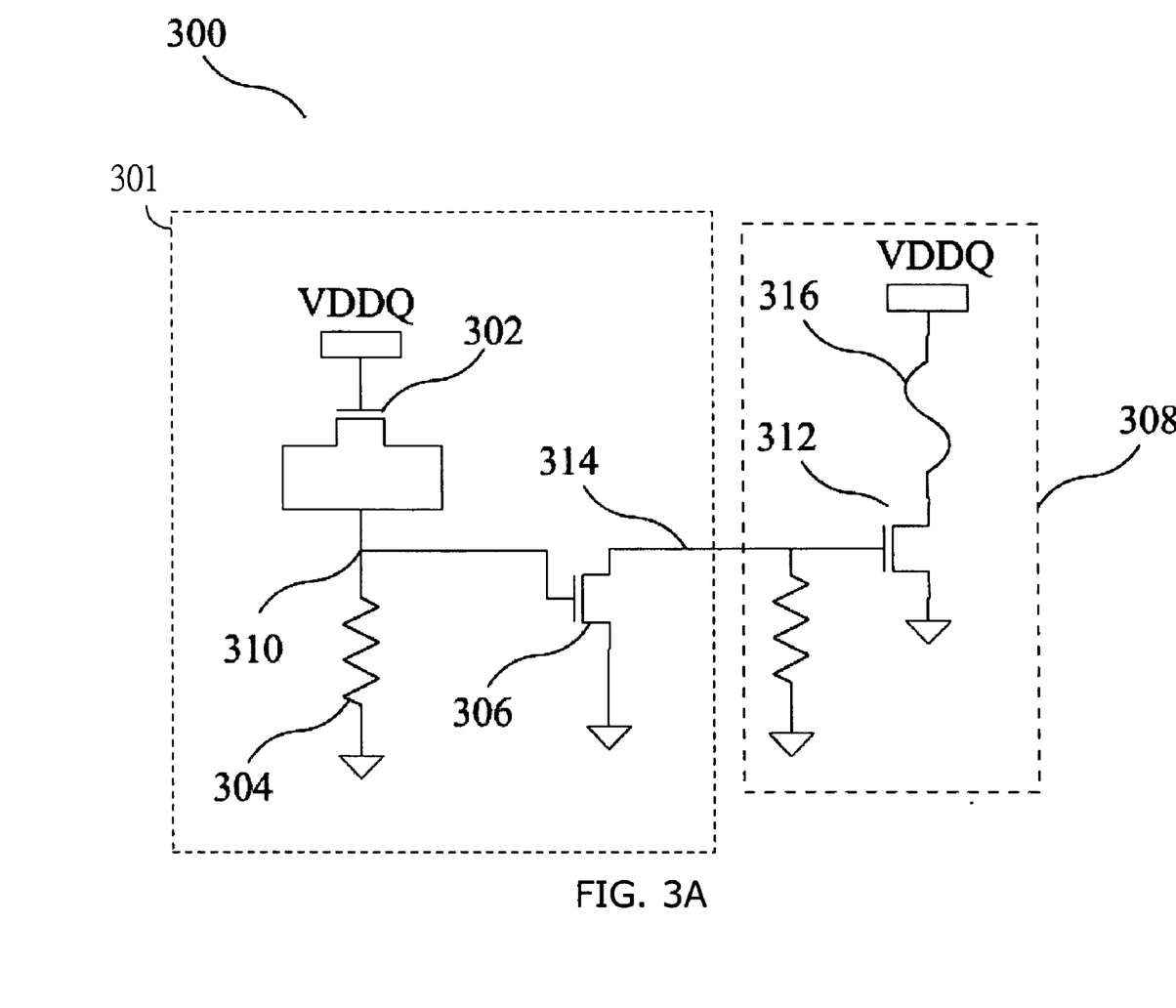
FIG. 3A presents a diagram showing how a VDDQ protection circuit coupled to a fuse programming device protects the fuse programming device in accordance with the third embodiment of the present invention.

FIG. 3A presents a diagram 300 showing how a VDDQ protection circuit 301 coupled to a fuse programming circuit 308 protects the fuse programming circuit 308 in accordance with the third embodiment of the present invention. The VDDQ protection circuit 301 includes a resistor 304 and a NMOS 302, the combination of which may be seen as an RC network. The gate of the NMOS 302 is connected to VDDQ, while the source and the drain of the NMOS 302 are connected to one end of the resistor 304 via a node 310. The other end of the resistor 304 is connected to ground. A switch NMOS 306 is connected between the node 310 and a node 314, which further connects to the gate of a program device 312 of the fuse programming circuit 308.

When VDDQ is suddenly applied, the NMOS 302 appears as a short connection, thereby causing the node 310 to go high momentarily. A high signal at the node 310 turns on the switch NMOS 306, and forces the node 314 to a solid ground potential. The solid ground potential prevents VDDQ voltage spike from coupling the gate of the program device 312 and keeping the fuse programming circuit 308 from accidentally programming an electrical fuse 316 of the fuse programming circuit 308. The protection duration from a VDDQ voltage spike depends on the RC time constant of the RC network.

Figure 3B:
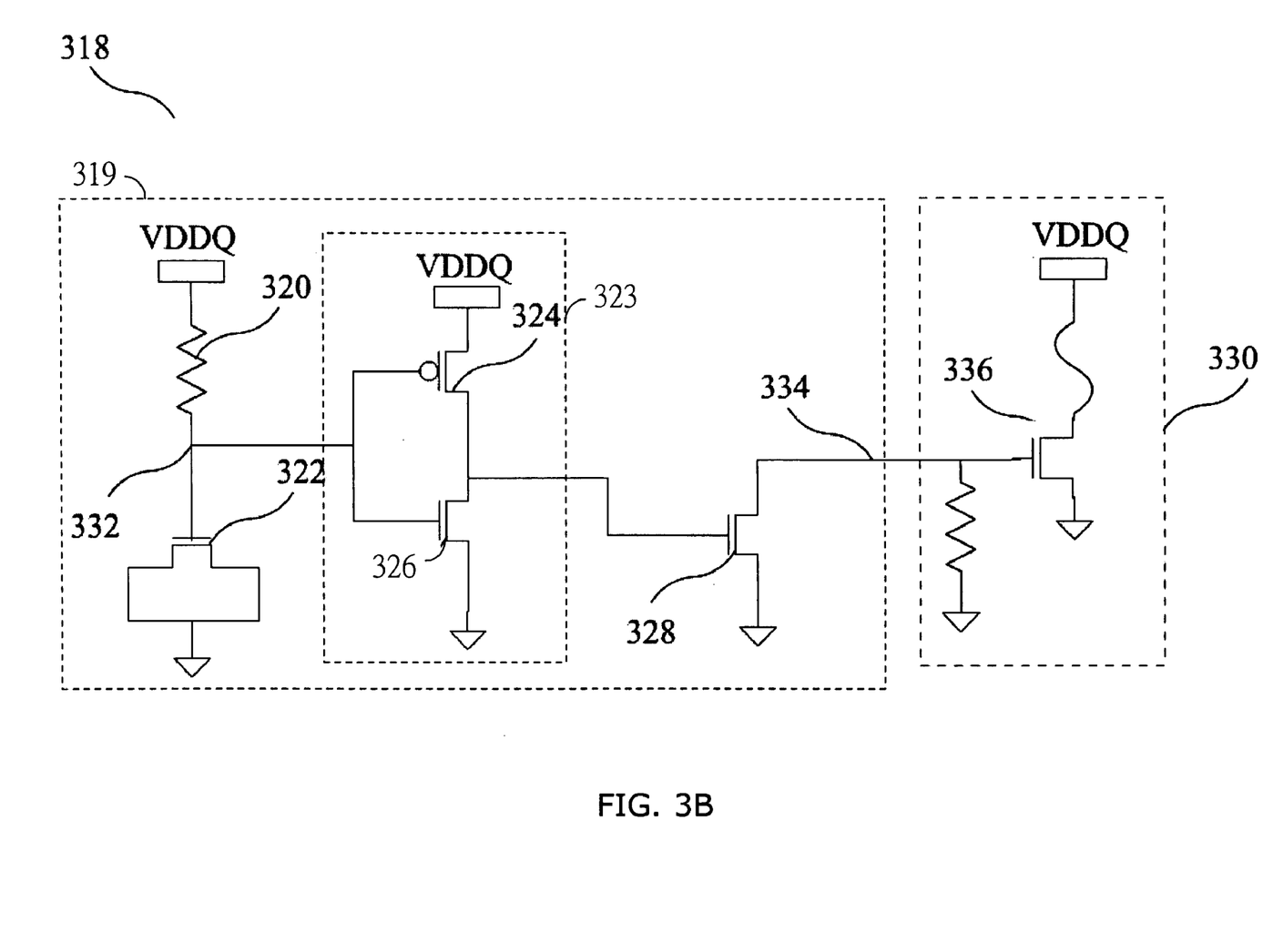
FIG. 3B presents a diagram showing how another VDDQ protection circuit coupled to a fuse programming device protects the fuse programming device in accordance with the fourth embodiment of the present invention.

FIG. 3B presents a diagram 318 showing how another VDDQ protection circuit 319 coupled to a fuse programming circuit 330 protects the fuse programming circuit 330 in accordance with the fourth embodiment of the present invention. The VDDQ protection circuit 319 includes a resistor 320 and a capacitor 322, the combination of which may be seen as an RC network. The gate of the NMOS 322 is connected, via a node 332, to one end of the resistor 320, while the source and the drain of the NMOS 322 are connected to ground. The other end of the resistor 320 is connected to VDDQ. The VDDQ protection circuit 319 further includes an inverter 323 and a switch NMOS 328. The node 332 is connected to the gates of PMOS 324 and NMOS 326, which together form the inverter 323. The inverter output of the inverter 323 is received by a switch NMOS 328, whose source connects to ground and whose drain connects, via a node 334, to the gate of a program device 336.

The diagram 318 is similar to the diagram 300 except that the positions of the NMOS and the resistor in the RC network are reversed, and that the inverter 323 is added. When VDDQ is suddenly applied, the node 332 is pulled low to solid ground, thereby causing the output of the inverter 323 to go high, and thereby turning on the switch NMOS 328. Furthermore, the node 334 is pulled to ground, thereby turning off the program device 330. The protection duration from a VDDQ voltage spike depends on the RC time constant of the RC network.

In this embodiment, the RC network consumes a large area and thus their implementation may need to be separated by large distances to prevent performance degradation. One advantage of this embodiment is that one VDDQ protection circuit can potentially drive various fuse programming circuits through many inverters 323 functioning as buffers.

Figure 4A:
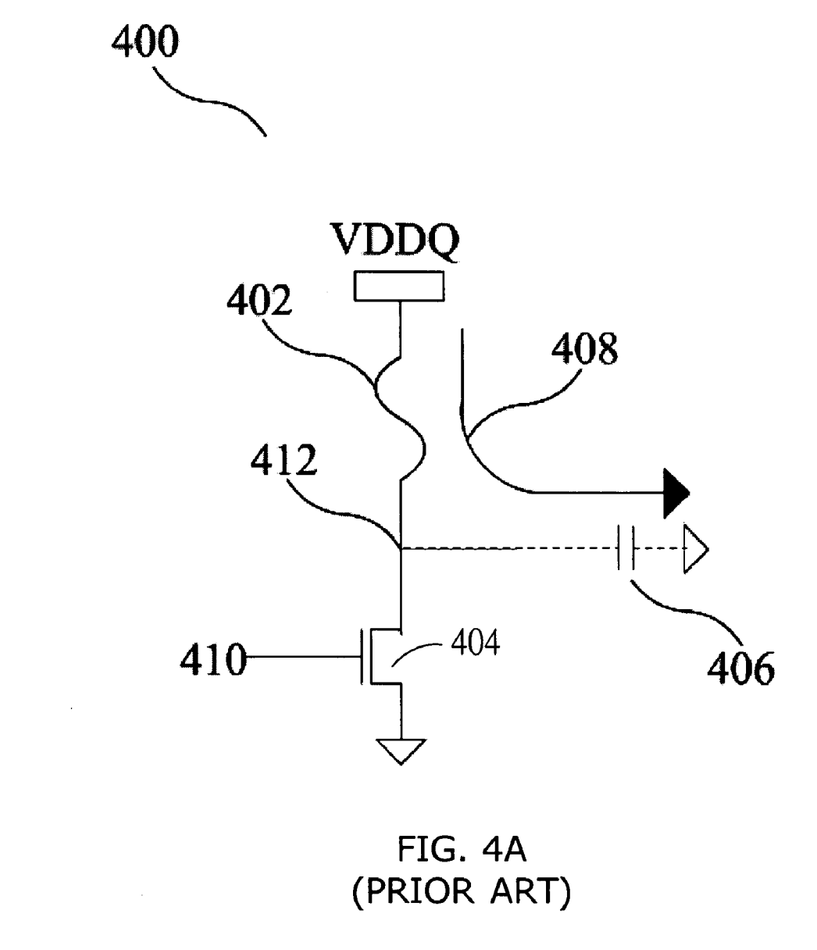
FIG. 4A illustrates a conventional program circuit showing how a parasitic discharge may damage an electrical fuse.

FIG. 4A illustrates a conventional program circuit 400 showing how a parasitic discharge may damage an electrical fuse 402. Normally, an electrical fuse is constructed away from the program device. This is due to the large area required by the program device to have sufficient current to properly program an electrical fuse. However, such a configuration typically creates a substantial level of parasitic capacitance, which results in unwanted parasitic discharge.

In this example, the drain capacitance of a large program device 404 controllable by a signal 410 and the parasitic capacitance at a node 412 are illustrated by a parasitic capacitor 406. The parasitic capacitor 406 and the resistance of the electrical fuse 402 constitute an RC network having an RC parasitic discharge path 408 from VDDQ to ground.

When high voltage VDDQ is suddenly raised, the parasitic capacitor 406 appears shorted, thereby causing a current to flow through the electrical fuse 402. The current flowing through the electrical fuse 402 is limited by the voltage at VDDQ divided by the fuse resistance. If VDDQ is not well clamped from ESD protection, it might be high enough to generate a large current. This large current may be sufficient to program the electrical fuse 402 through the path 408 if the RC time constant of the RC network is long enough.

Figure 4B:
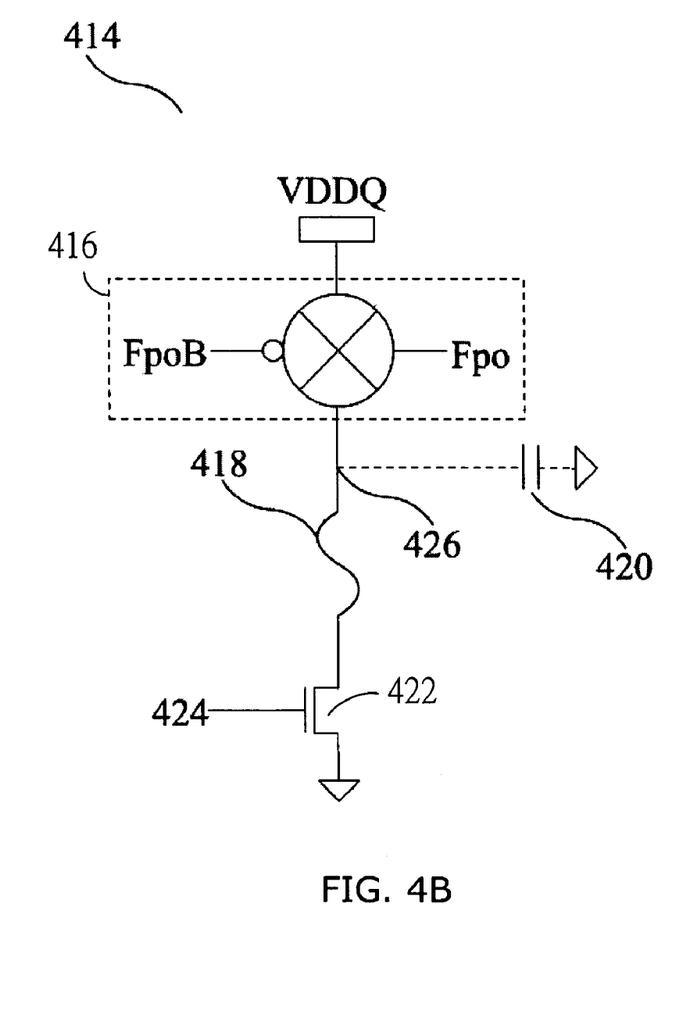
FIG. 4B illustrates a modified program circuit with a parasitic discharge protection module in accordance with the fifth embodiment of the present invention.

FIG. 4B illustrates a modified program circuit 414 with a parasitic discharge protection module 416 in accordance with the fifth embodiment of the present invention. As shown in FIG. 4B, the parasitic discharge protection module 416 is a pass-gate connected to VDDQ and a node 426, which is further connected to one end of an electrical fuse 418. The other end of the electrical fuse 418 is connected to a program device 422. A node 424 having a program signal connects to the gate of program device 422. In effect, a parasitic capacitor 420 is now connected between the node 426 and ground or VSS.

The parasitic discharge protection module 416, having a predetermined resistance and when coupled with the parasitic capacitor 420, is used to create an RC network, which is used to bypass the current path created by a sudden VDDQ peak without going through the fuse. The parasitic discharge protection module 416 is controlled by a control signal Fpo and its complementary signal FpoB. If the electrical fuse 418 is to be programmed, a high voltage VDDQ will increase in order to provide enough current to break the electrical fuse 418. If the parasitic discharge protection module 416 is a pass-gate, the control signals Fpo and FpoB command pass-gate to open. This opens up a path for the high voltage VDDQ to provide the current necessary to program the electrical fuse 418.

It is understood that the technique of using a pass-gate to protect the electrical fuse can be used in a single fuse cell or an array of fuse cells.

Figure 5A:
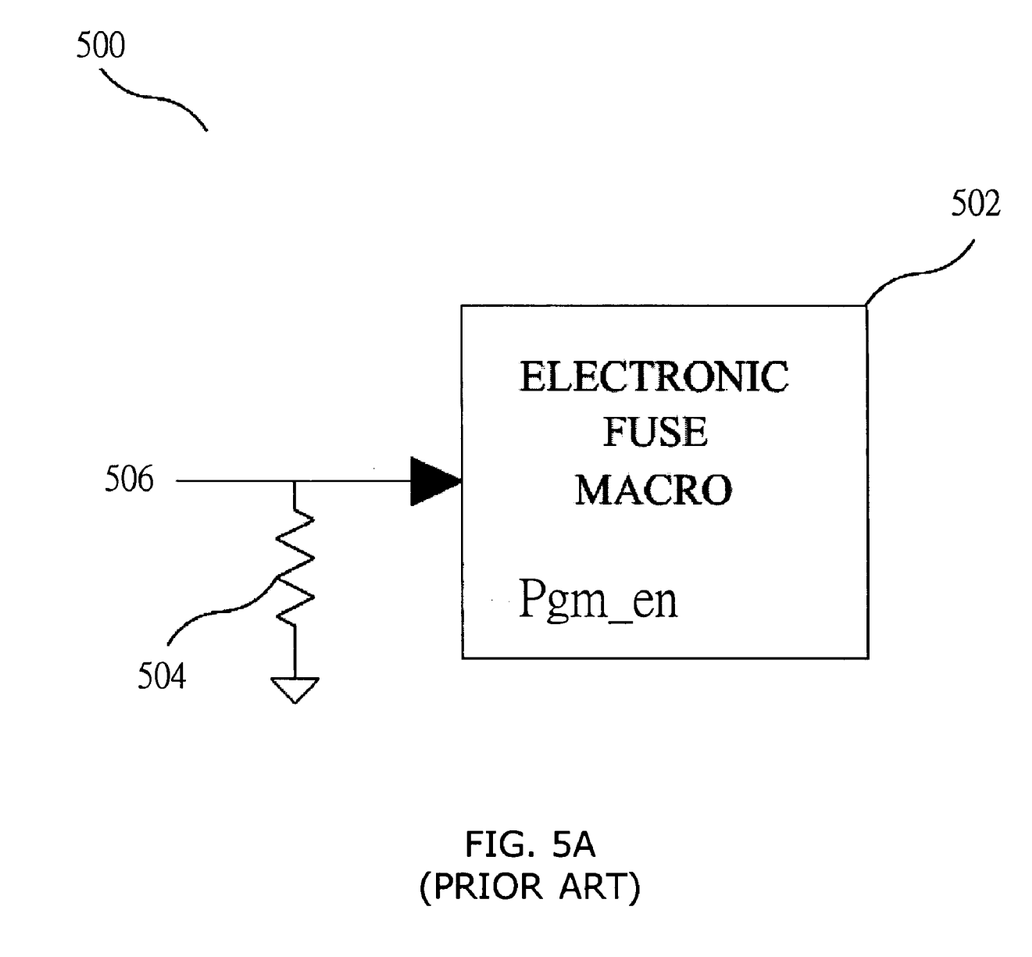
FIG. 5A illustrates a conventional circuit with a standard protection module.

FIG. 5A illustrates a conventional circuit 500 with an electrical fuse macro 502 and a standard protection module, shown as a resistor 504. The resistor 504 is connected to a program signal 506 and provides a low resistive path to ground. This path protects the program signal 506 (or a program pin that this signal is attached to, e.g., Pgm_en). The program signal 506 is further connected to the electronic fuse macro 502. If the program signal 506 is high, the electronic fuse macro 502 is enabled. The resistor 504 assures that the programming is truly intentional when the program signal 506 is high enough. The electronic fuse macro 502 will be programmed when the program voltage at the high voltage VDDQ provides the necessary current for the electronic fuse macro 502. When internal VDD and program signal are floating, and if a high voltage VDDQ is applied, the VDDQ spike may couple to the program signal 506. If the electrical fuse is used as a standalone chip, this approach may be valid, but it would not be if the fuse is used as an embedded fuse macro.

Figure 5B:
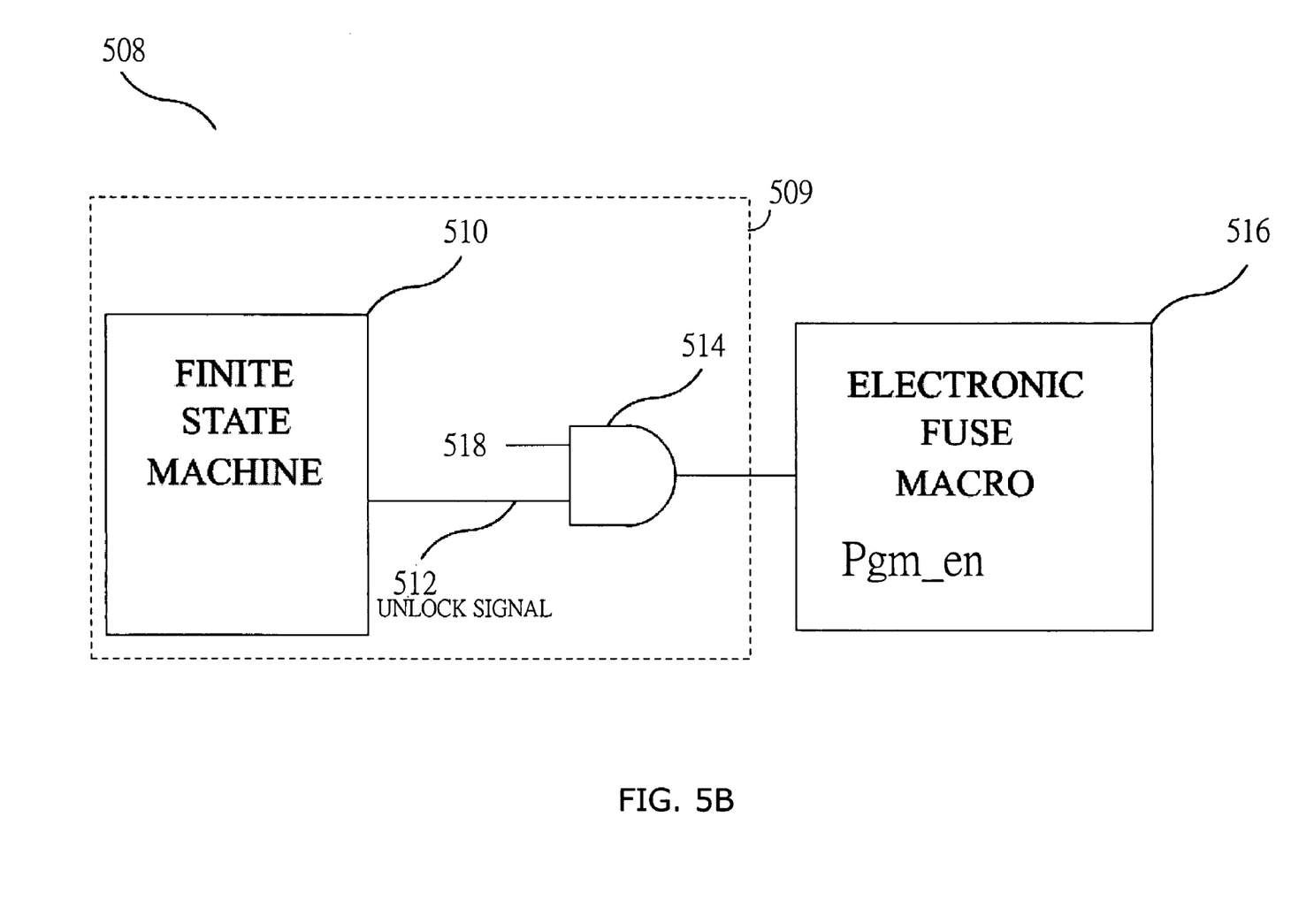
FIG. 5B illustrates a circuit protected by a finite state machine protection module in accordance with the sixth embodiment of the present invention.

FIG. 5B illustrates a circuit 508 protected by a finite state machine protection (FSM) module 509 in accordance with the sixth embodiment of the present invention. The circuit 508 includes the FSM protection module 509 and an electronic fuse macro 516, which is protected by the FSM protection module 509. The FSM module 509 includes a FSM 510, whose output is a control signal 512 such as an "unlock signal" in this case that connects to one input of a 2-input AND gate 514. The other input of the 2-input AND gate 514 is an internally generated program signal 518. The output of the AND gate 514 is connected to the program pin of the electronic fuse macro 516.

In one example, the FSM 510 is simply a one-input, one-output state machine. The FSM 510 stays low at all time except that it asserts a high output on the wire 512 when it recognizes a predetermined input bit sequence. The FSM 510 will continue checking for the proper bit sequence during the power up process, and does not assert the high output until it has stopped recognizing the stored string. This bit sequence is an "unlock" sequence that prohibits the wire 512 to be high by accident. For example, after recognizing a stored bit sequence of "5555" followed by a string of "AAAA", the FSM 510 asserts a "1" on the wire 512. This must be happening when the fuse is to be programmed and the program signal 518 is also asserted as a "1". This protection mechanism is necessary due to the unknown state of the program signal 518 during the power up process. If the program signal 518 were to be high during the power up process, the electronic fuse macro 516 may be programmed accidentally without the FSM protection module 509.

Figure 6:
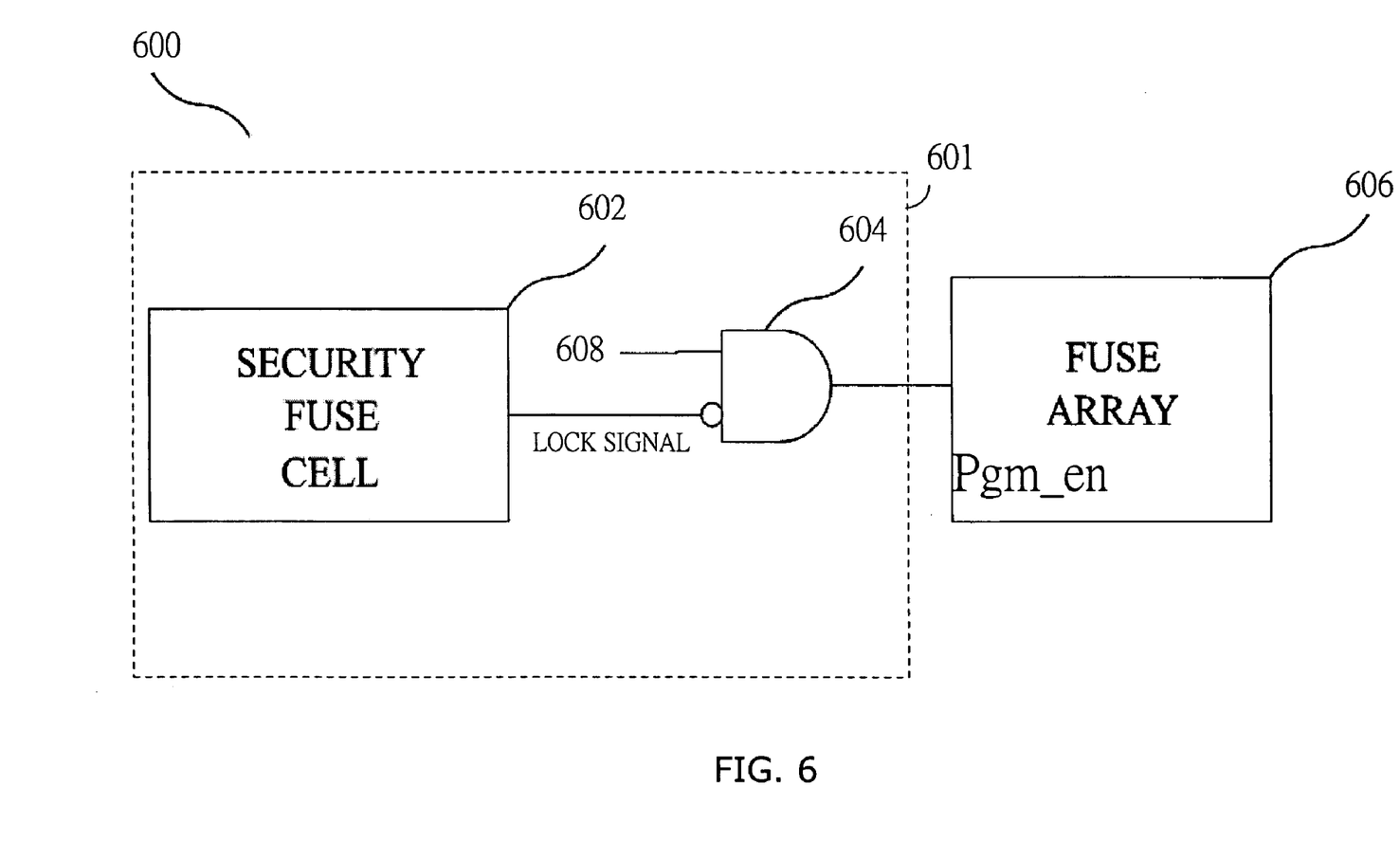
FIG. 6 presents a circuit with a fuse array protected by a security protection module in accordance with the seventh embodiment of the present invention.

FIG. 6 presents a circuit 600 with a fuse array or fuse macro 606 protected by a security protection module 601 in accordance with the seventh embodiment of the present invention. The fuse array contains at least one electrical fuse as described above. The security protection module 601 includes a security fuse cell 602 and a 2-input AND gate 604. The output of the security fuse cell 602 is connected to an inverted input of the AND gate 604, while an internally generated program signal 608 is connected to the non-inverted input of the AND gate 604. The output of the AND gate 604 connects to the program pin of the fuse array 606. When the security fuse cell 602 is blank, or un-programmed, the output signal from the security fuse cell 602 is low. This allows an internally generated program signal 608 to program the fuse array 606. After the fuse array 606 is programmed, the security fuse cell 602 will be programmed next. Once the security fuse cell 602 is programmed, the output of the security fuse cell 602, which can be viewed as a control signal (e.g.; a "lock signal" in this case) goes high. After this signal passes through the AND gate 604, the output of the AND gate 604 is forced the program pin Pgm_en to zero, thus prohibiting further programming of the fuse array 606. It is understood that a fuse macro or fuse array can have either or both the state machine protection module and the security protection module.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrical fuse circuit with electrostatic discharge (ESD) protection, comprising:
    at least one electrical fuse;
    a programming device coupled in series with the electrical fuse having at least a transistor for receiving a control signal for controlling a programming current flowing through the electrical fuse;
    a voltage source coupled to the fuse and the programming device for providing the programming current; and
    a protection module coupled to a gate of the transistor at its first end for reducing charges accumulated at the gate of the transistor due to electric static charges arriving at the voltage source, thereby preventing the programming device from accidentally programming the fuse; and
    a voltage source protection circuit coupled to the protection module for providing the control signal, the voltage source protection circuit having an RC network and transistor combination for preventing spikes appearing on the voltage source to accidentally program the fuse.

2. The circuit of claim 1 wherein a node between a capacitance device and a resistance device of the RC network controls a switch whose output provides the control signal.

3. The circuit of claim 2 wherein the switch is an NMOS transistor with its source connected to ground or VSS.

4. The circuit of claim 1 wherein the voltage source protection circuit further includes an inverter with its input coupled to a node between a capacitance device and a resistance device of the RC network and its output controls a switch whose output further provides the control signal, wherein the RC network has its resistance device coupled to the voltage source.

5. An electrical fuse circuit with electrostatic discharge (ESD) protection, comprising:
    at least one electrical fuse;
    a programming device coupled in series with the electrical fuse having at least a transistor for receiving a control signal for controlling a programming current flowing through the electrical fuse;
    a driver coupled to a pre-driver protection circuit for providing the control signal;
    a voltage source coupled to the fuse and the programming device for providing the programming current;
    a protection module coupled to a gate of the transistor at its first end for reducing charges accumulated at the gate of the transistor due to electric static charges arriving at the voltage source, wherein the protection module prevents the programming device from programming the fuse, and wherein the pre-driver protection circuit prohibits an erroneous control signal to be generated during a power on process; and
    a voltage source protection circuit coupled to the protection module for providing the control signal, the voltage source protection circuit having an RC network and transistor combination for preventing spikes appearing on the voltage source from accidentally programming the fuse.

6. The circuit of claim 5 wherein a node between a capacitance device and a resistance device of the RC network controls a switch whose output provides the control signal.

* * * * *